(12) United States Patent
Iwata

(10) Patent No.: US 9,281,340 B2
(45) Date of Patent: Mar. 8, 2016

(54) MANUFACTURING METHOD FOR PHOTOELECTRIC CONVERSION APPARATUS AND PHOTOELECTRIC CONVERSION APPARATUS

(71) Applicant: CANON KABUSHIKI KAISHA, Tokyo (JP)

(72) Inventor: Junji Iwata, Tokyo (JP)

(73) Assignee: CANON KABUSHIKI KAISHA, Tokyo (JP)

(*) Notice: Subject to any disclaimer, the term of this patent is extended or adjusted under 35 U.S.C. 154(b) by 0 days.

(21) Appl. No.: 14/548,153

(22) Filed: Nov. 19, 2014

(65) Prior Publication Data

US 2015/0145087 A1 May 28, 2015

(30) Foreign Application Priority Data

Nov. 22, 2013 (JP) .................................. 2013-241947

(51) Int. Cl.
*H01L 27/146* (2006.01)
*H01L 21/00* (2006.01)

(52) U.S. Cl.
CPC ...... *H01L 27/14698* (2013.01); *H01L 27/1461* (2013.01); *H01L 27/1463* (2013.01); *H01L 27/14609* (2013.01); *H01L 27/14627* (2013.01); *H01L 27/14641* (2013.01); *H01L 27/14687* (2013.01)

(58) Field of Classification Search
None
See application file for complete search history.

(56) References Cited

U.S. PATENT DOCUMENTS

| 8,013,369 | B2 * | 9/2011 | Iwata et al. | 257/290 |
|---|---|---|---|---|
| 2003/0214595 | A1 * | 11/2003 | Mabuchi | 348/294 |
| 2004/0100570 | A1 * | 5/2004 | Shizukuishi | 348/272 |
| 2004/0173824 | A1 * | 9/2004 | Nagasaki et al. | 257/255 |
| 2006/0065896 | A1 * | 3/2006 | Abe | H01L 27/1463 257/69 |
| 2006/0180885 | A1 * | 8/2006 | Rhodes | 257/432 |
| 2007/0018264 | A1 * | 1/2007 | Rhodes et al. | 257/432 |
| 2008/0067556 | A1 * | 3/2008 | Suzuki et al. | 257/225 |
| 2008/0283726 | A1 * | 11/2008 | Uya et al. | 250/208.1 |
| 2009/0303371 | A1 * | 12/2009 | Watanabe et al. | 348/311 |
| 2010/0123069 | A1 * | 5/2010 | Mao et al. | 250/214.1 |
| 2010/0127314 | A1 * | 5/2010 | Frach | 257/292 |
| 2010/0148289 | A1 * | 6/2010 | McCarten et al. | 257/432 |
| 2010/0230583 | A1 * | 9/2010 | Nakata et al. | 250/227.2 |
| 2011/0109776 | A1 * | 5/2011 | Kawai | 348/273 |
| 2011/0234868 | A1 * | 9/2011 | Yamashita et al. | 348/294 |
| 2011/0273598 | A1 * | 11/2011 | Ogino et al. | 348/272 |
| 2012/0194696 | A1 * | 8/2012 | Ohshitanai et al. | 348/222.1 |
| 2013/0083225 | A1 * | 4/2013 | Minowa et al. | 348/294 |

FOREIGN PATENT DOCUMENTS

JP    2013-084742 A    5/2013

* cited by examiner

*Primary Examiner* — Evren Seven
(74) *Attorney, Agent, or Firm* — Canon USA, Inc. IP Division

(57) ABSTRACT

A manufacturing method for a photoelectric conversion apparatus in which a microlens is arranged for multiple electric charge accumulation regions formed on a semiconductor substrate, includes forming a first impurity region of a first conductive type on the semiconductor substrate; and forming a second impurity region of a second conductive type that is opposite the first conductive type in a part of the first impurity region to isolate the first impurity region into multiple regions such that each of the multiple electric charge accumulation regions includes isolated first impurity regions.

5 Claims, 5 Drawing Sheets

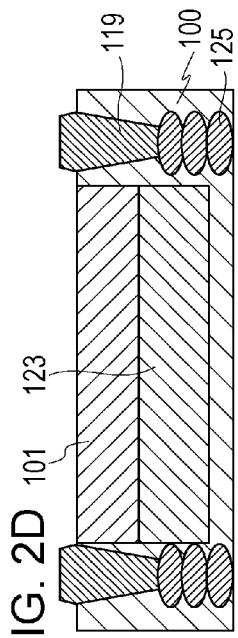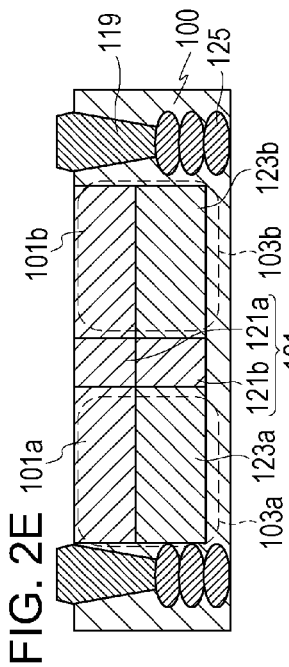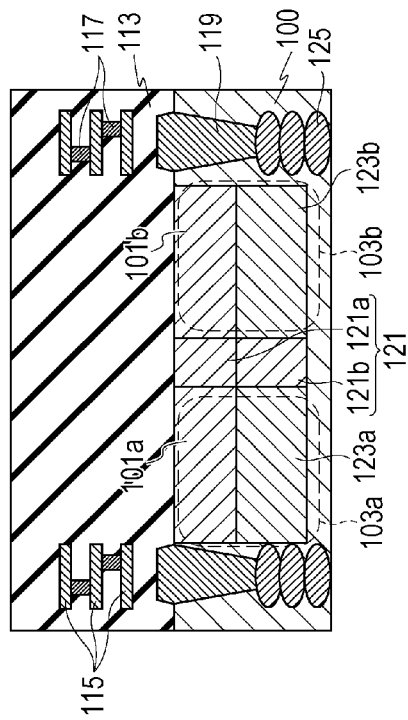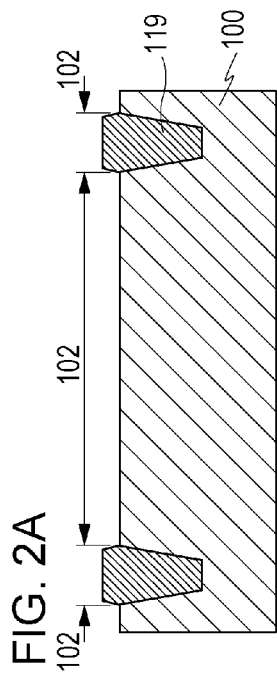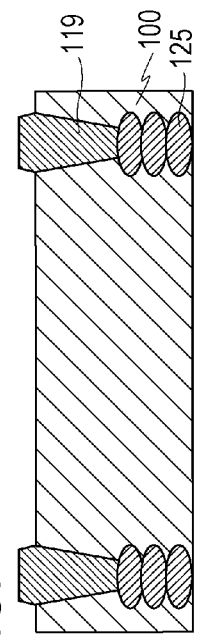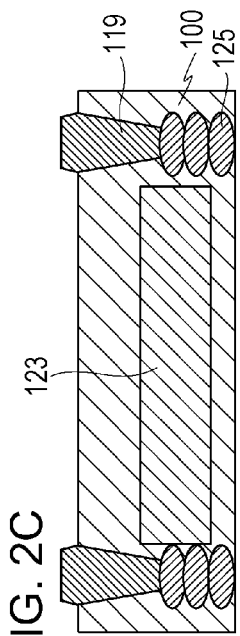

MANUFACTURING METHOD FOR PHOTOELECTRIC CONVERSION APPARATUS AND PHOTOELECTRIC CONVERSION APPARATUS

BACKGROUND OF THE INVENTION

1. Field of the Invention

The present invention relates to a manufacturing method for a photoelectric conversion apparatus and a photoelectric conversion apparatus.

2. Description of the Related Art

A structure of a photoelectric conversion apparatus in which multiple photoelectric conversion elements are arranged for one microlens (hereinafter, may be referred to as an ML) has been known (Japanese Patent Laid-Open No. 2013-84742). In such a photoelectric conversion apparatus, light is condensed onto multiple photoelectric conversion elements using a single ML, and focus detection is performed using signals of the multiple photoelectric conversion elements. A method for forming an electric charge accumulation region in each photoelectric conversion element by performing ion implantation using a mask pattern having an independent resist aperture region for each electric charge accumulation region has been known.

An electric charge accumulation region included in a photoelectric conversion element greatly affects, in particular, the performance of signal detection. Therefore, it is required to highly accurately form an electric charge accumulation region having desired properties.

In a structure disclosed in Japanese Patent Laid-Open No. 2013-84742 in which multiple N-type electric charge accumulation regions are isolated by a P-type impurity region of a conductive type opposite a conductive type of the electric charge accumulation regions, the P-type impurity region is formed in close proximity to the electric charge accumulation regions. Therefore, the distance between the P-type impurity region and each of the electric charge accumulation regions greatly affects the accumulation capacity of signal electric charges in the electric charge accumulation region. In manufacturing a photoelectric conversion element having the structure disclosed in Japanese Patent Laid-Open No. 2013-84742, in a case where an independent aperture is formed for each region of a mask in which an electric charge accumulation region is to be formed and ion implantation is performed, a displacement of the electric charge accumulation region with respect to a desired formation position occurs. With such a displacement, variations in the distance between an electric charge accumulation region and a P-type impurity region increase, and variations in the capacity of the electric charge accumulation region thus increase.

The above-mentioned point is particularly an issue to be addressed for a photoelectric conversion apparatus including multiple photoelectric conversion elements for a single ML, as disclosed in Japanese Patent Laid-Open No. 2013-84742. A reason for this issue is that the number of photoelectric conversion elements in a photoelectric conversion apparatus in which multiple photoelectric conversion elements are arranged for a single ML is greater than the number of photoelectric conversion elements in a photoelectric conversion apparatus in which a single photoelectric conversion element is arranged for a single ML. There is a tendency in which in accordance with an increase in the number of photoelectric conversion elements, the size of an electric charge accumulation region included in each photoelectric conversion element becomes smaller than the size of an electric charge accumulation region in a photoelectric conversion apparatus in which a single photoelectric conversion element is arranged for a single ML. In addition, in accordance with a miniaturization in the size of an electric charge accumulation region, in formation of the electric charge accumulation region using a mask pattern, the rate of the amount of displacement of a mask pattern relative to the size of the electric charge accumulation region in a substrate in-plane direction increases. Therefore, variations in the capacity of an electric charge accumulation region caused by variations in the relative positional relationship between the electric charge accumulation region and a P-type impurity region increase.

The present invention reduces, in manufacturing a photoelectric conversion apparatus in which multiple photoelectric conversion elements are arranged for a single ML, variations in the relative positional relationship between an electric charge accumulation region in each photoelectric conversion element and an isolation region arranged between the electric charge accumulation regions.

SUMMARY OF THE INVENTION

According to an aspect of the present invention, a manufacturing method for a photoelectric conversion apparatus in which a microlens is arranged for multiple electric charge accumulation regions formed on a semiconductor substrate, includes forming a first impurity region of a first conductive type on the semiconductor substrate; and forming a second impurity region of a second conductive type that is opposite the first conductive type in a part of the first impurity region to isolate the first impurity region into multiple regions such that each of the multiple electric charge accumulation regions includes isolated first impurity regions.

According to another aspect of the present invention, in a photoelectric conversion apparatus in which a microlens is arranged for multiple electric charge accumulation regions formed on a semiconductor substrate, a first impurity region of a first conductive type and a second impurity region of the first conductive type which is positioned deeper than the first impurity region, are arranged between the multiple electric charge accumulation regions, each of the electric charge accumulation regions includes a third impurity region of a second conductive type which is opposite the first conductive type, and a fourth impurity region of the second conductive type which is positioned deeper than the third impurity region, the third impurity region is formed at a same depth as the first impurity region, and is in contact with the first impurity region, the fourth impurity region is formed at a same depth as the second impurity region, and is in contact with the second impurity region, and in each of the electric charge accumulation regions, an area of the fourth impurity region in an in-plane direction of the semiconductor substrate is smaller than an area of the third impurity region in an in-plane direction of the semiconductor substrate.

According to another aspect of the present invention, a photoelectric conversion apparatus in which a microlens is arranged for multiple electric charge accumulation regions formed on a semiconductor substrate, a first impurity region of a first conductive type and a second impurity region of the first conductive type which is positioned deeper than the first impurity region, are arranged between the multiple electric charge accumulation regions, each of the electric charge accumulation regions includes a third impurity region of a second conductive type which is opposite the first conductive type, and a fourth impurity region of the second conductive type which is positioned deeper than the third impurity region, the third impurity region is formed at a same depth as the first impurity region, and is in contact with the first impurity region, the fourth impurity region is formed at a same depth as the second impurity region, and is in contact with the second impurity region, and an impurity concentration of the second conductive type of the first impurity region is lower than an impurity concentration of the second conductive type of the second impurity region.

Further features of the present invention will become apparent from the following description of exemplary embodiments with reference to the attached drawings.

BRIEF DESCRIPTION OF THE DRAWINGS

FIGS. 2A, 2B, 2C, 2D, 2E, and 2F explain a manufacturing process for the photoelectric conversion apparatus according to the first embodiment.

DESCRIPTION OF THE EMBODIMENTS

Hereinafter, manufacturing methods according to embodiments of the present invention will be described with reference to the drawings. In the parts which are not specifically illustrated in figures or described herein, publicly-known or well-known technologies in the technical field are used. The embodiments described hereinafter are aspects of the present invention, and the present invention is not limited to them. In the embodiments described below, a case where electrons are used as signal electric charges will be explained by way of example. When holes are used as signal electric charges, conductive types of all the impurity regions should be inverted.

First Embodiment

Figure 1A:
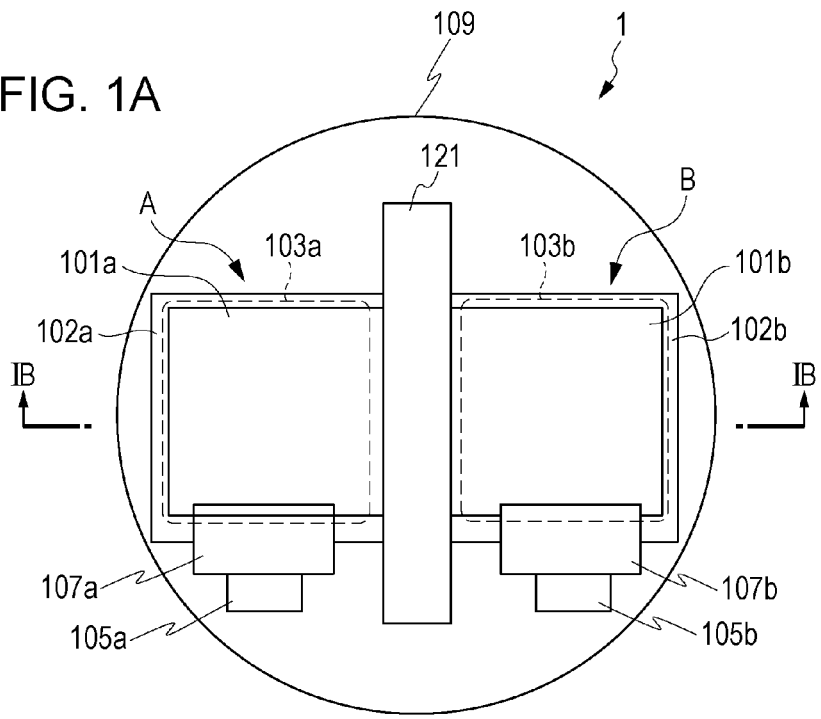
FIGS. 1A and 1B explain a photoelectric conversion apparatus according to a first embodiment.
Figure 1B:
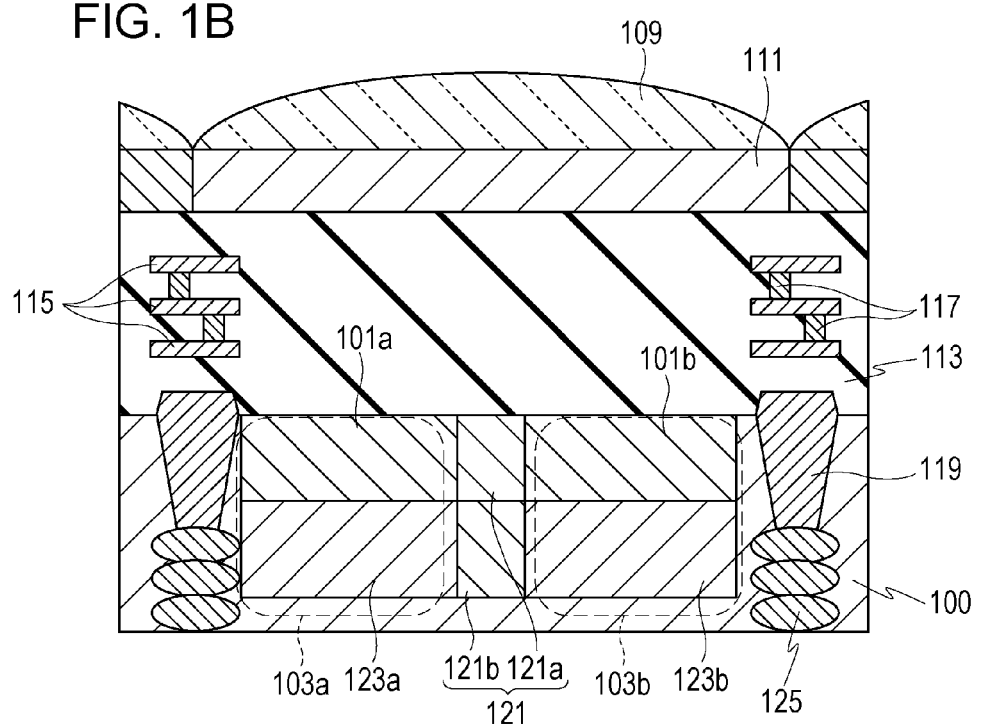

A first embodiment of the present invention will be described with reference to FIGS. 1A and 1B. FIG. 1A is a plan view of a part of a photoelectric conversion unit 1 included in a photoelectric conversion apparatus, and FIG. 1B is a cross-section view of the photoelectric conversion unit 1 taken along the solid line IB-IB of FIG. 1A. The photoelectric conversion unit 1 according to the first embodiment includes two photoelectric conversion elements: a photoelectric conversion element A and a photoelectric conversion element B. When individual elements included in the photoelectric conversion elements A and B are described, corresponding alphabets will be attached at the end of each sign. However, when characteristics and properties common to elements are described, alphabets may be omitted.

Hereinafter, a description will be provided with reference to FIG. 1A. Photoelectric conversion elements are provided on a semiconductor substrate (hereinafter, may be simply referred to as a substrate) 100. On a surface of the substrate 100, an active region 102 is formed. The photoelectric conversion elements each include an electric charge accumulation region 103 which includes an impurity region 101, a floating diffusion region (hereinafter, referred to as an FD region) 105, and a gate electrode 107 which transmits electric charges accumulated in the impurity region 101 to the FD region 105. Each of the impurity region 101 and the FD region 105 is formed of an N-type impurity region and is formed inside the active region 102. The FD region 105 may be shared by multiple photoelectric conversion elements. Further, the electric conversion elements may each include an output region which outputs a signal in accordance with a voltage of the FD region.

Between impurity regions 101a and 101b, an isolation region 121 is formed. The isolation region 121 is formed of a P-type impurity, which is of a conductive type opposite a conductive type of an N-type impurity forming the impurity regions 101a and 101b, and thereby allows isolation between the impurity regions 101a and 101b. The N-type impurity concentration of the impurity region 101a is higher than the P-type impurity concentration of the impurity region 101a. Similarly, the N-type impurity concentration of the impurity region 101b is higher than the P-type impurity concentration of the impurity region 101b. In contrast, the P-type impurity concentration of the isolation region 121 is higher than the N-type impurity concentration of the isolation region 121. Thus, the isolation region 121 functions as a potential barrier to signal electric charges generated in the impurity regions 101a and 101b, and allows electric isolation between the impurity regions 101a and 101b.

Next, a description will be provided with reference to FIG. 1B. A microlens 109 is arranged for one photoelectric conversion unit 1. Light collected by the microlens 109 passes through a color filter 111 and an interlayer insulation film 113, and then enters each of the photoelectric conversion elements A and B. The incident light is converted into signal electric charges in the electric charge accumulation regions 103a and 103b. The electric charge accumulation region 103 includes, in addition to the impurity region 101, an impurity region 123 which includes an N-type impurity. The impurity region 123 is an N-type impurity region formed in a position deeper than the impurity region 101 of the substrate. The impurity region 123 is formed such that the impurity region 123 and the impurity region 101 at least partially overlap in an in-plane direction of the substrate 100. By further forming an impurity region in the depth direction, the pixel density can be improved while the capacity of signal electric charges of the electric charge accumulation region 103 being maintained. The impurity region 123 is also electrically isolated by the isolation region 121, as with the impurity region 101. More specifically, between the impurity regions 101a and 101b, an isolation region 121a is arranged, and between impurity regions 123a and 123b, an isolation region 121b is arranged.

Wiring 115 includes, typically, multiple wiring layers and multiple conductive patterns included in the individual wiring layers. The wiring 115 includes a line which applies a bias for driving to a metal oxide semiconductor (MOS) transistor, such as the gate electrode 107, a line which transfers electric charges generated by photoelectric conversion to a peripheral signal processing circuit, a line which blocks light, and the like. The multiple wiring layers are interconnected by vias 117.

An example of a manufacturing method for the photoelectric conversion apparatus according to the first embodiment will be described below with reference to FIGS. 2A to 2F.

First, an element isolation region 119 is formed in the substrate 100, and the active region 102 is defined (FIG. 2A). For the element isolation region 119, for example, insulator isolation such as local oxidation of silicon (LOCOS), shallow trench isolation (STI), or the like, may be used.

By performing ion implantation of a P-type impurity, a high-concentration P-type impurity region 125 is formed below the element isolation region 119 (FIG. 2B). The P-type impurity region 125 has an effect of restraining movement of signal electric charges between adjoining photoelectric conversion units.

Next, by performing ion implantation of an N-type impurity into the active region 102, the impurity region 123 is formed (FIG. 2C).

Then, by performing ion implantation of an N-type impurity into the active region 102, the impurity region 101 is formed (FIG. 2D). The order of formation of the impurity region 101 and the impurity region 123 may be reversed. An example of the impurity concentration of the impurity regions 101 and 123 is within a range between $1 \times 10^{16}$ and $1 \times 10^{18}$ [atoms/cm$^3$].

By performing ion implantation of a P-type impurity into a part of each of the impurity region 101 and the impurity region 123, the isolation regions 121a and 121b are formed. Thus, the impurity region 101 is isolated into the impurity regions 101a and 101b, and the impurity region 123 is isolated into the impurity regions 123a and 123b (FIG. 2E). An example of the impurity concentration of the isolation region 121 is within a range between $1 \times 10^{16}$ and $2 \times 10^{18}$ [atoms/cm$^3$]. The isolation regions 121a and 121b may be formed in a single process. Alternatively, the isolation regions 121a and 121b may be formed in individual processes with different ion implantation energies.

After that, the interlayer insulation film 113, the wiring 115, and the vias 117 are formed. Then, the color filter 111 and the microlens 109 are formed. Thus, the structure illustrated in FIG. 1B is obtained.

As described above, in the first embodiment, in manufacturing a photoelectric conversion apparatus in which one microlens is arranged for multiple electric charge accumulation regions, an N-type impurity region is formed, and after that, a P-type isolation region of a conductive type opposite a conductive type of the N-type impurity region is formed in the N-type impurity region. With the formation of the P-type impurity region, the N-type impurity region is isolated into multiple regions, and electric charge accumulation regions corresponding to the individual photoelectric conversion elements are formed. With this manufacturing method, one end of an electric charge accumulation region of each photoelectric conversion element is defined by an isolation region. Therefore, variations in the distance between the isolation region and the electric charge accumulation region among processes can be greatly reduced. As a result, it is possible to reduce variations in the capacity of electric charge accumulation regions.

Second Embodiment

Figure 3A:
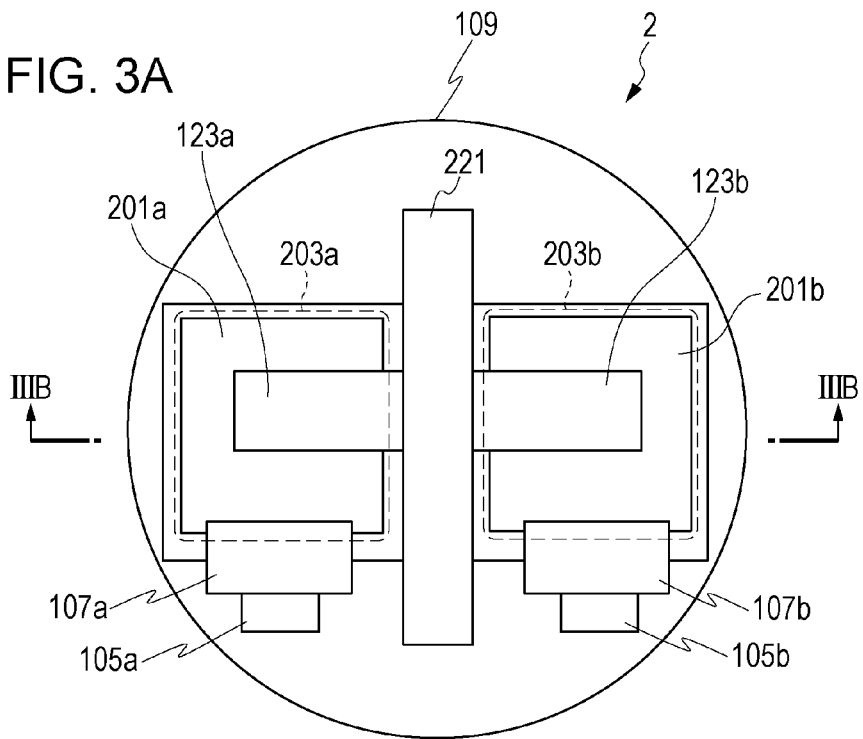
FIGS. 3A and 3B explain a photoelectric conversion apparatus according to a second embodiment.
Figure 3B:
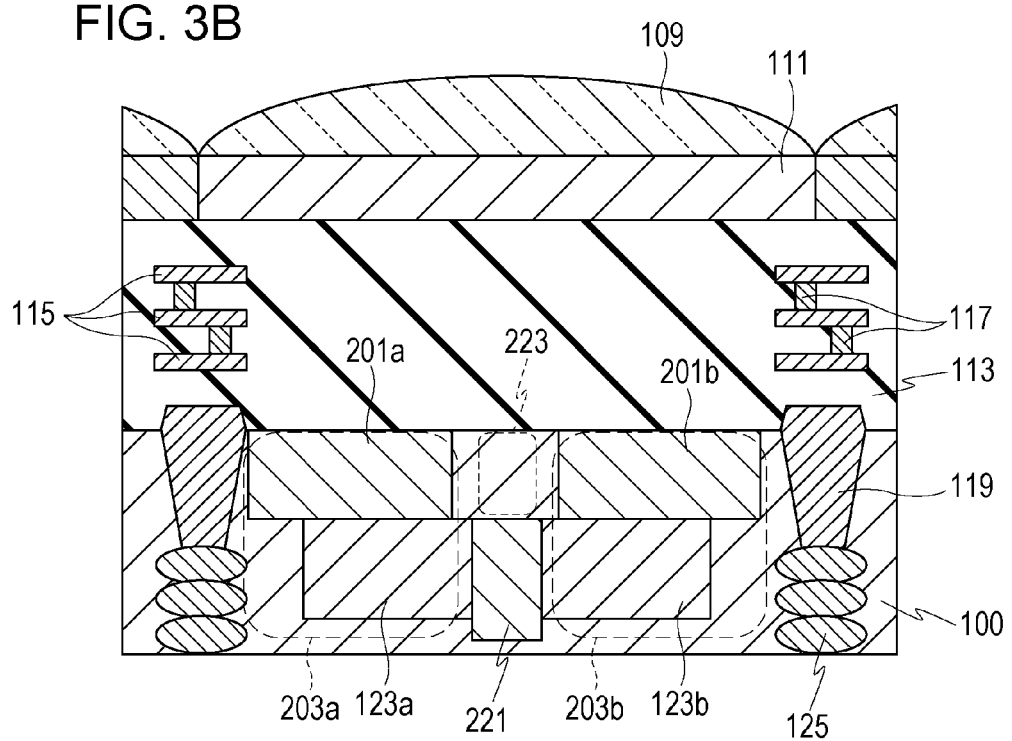

A second embodiment of the present invention will be described with reference to FIGS. 3A and 3B. FIG. 3A is a plan view of a part of a photoelectric conversion unit 2 included in a photoelectric conversion apparatus, and FIG. 3B is a cross-section view of the photoelectric conversion unit 2 taken along the solid line IIIB-IIIB of FIG. 3A. The functions and configurations of the second embodiment which are the same as those of the first embodiment are assigned the same signs, and the explanation of those same functions and configurations may be omitted.

A main difference from the photoelectric conversion apparatus according to the first embodiment is the formation position of an electric charge accumulation region which is formed at a shallower position of a substrate.

Hereinafter, the photoelectric conversion apparatus according to the second embodiment will be described with reference to FIG. 3A. In the second embodiment, an electric charge accumulation region 203 includes an impurity region 201 and the impurity region 123. The impurity region 201 is a part of the electric charge accumulation region and is formed such that the impurity region 201 is arranged at a position shallower than the impurity region 123 and the impurity region 201 and the impurity region 123 at least partially overlap in a plan view. While the impurity regions 123a and 123b are isolated by an isolation region 221 (in contact with the isolation region 221), impurity regions 201a and 201b are formed at mutually isolated positions by performing ion implantation into mutually isolated positions. The impurity regions 201a and 201b are formed at mutually isolated positions in such a manner that an impurity region of a conductive type opposite a conductive type of the impurity regions 201a and 201b exists between the impurity regions 201a and 201b.

Next, a description will be provided with reference to FIG. 3B.

As described above, the impurity regions 201a and 201b are formed at mutually isolated positions in such a manner that an impurity region 223 of a conductive type opposite a conductive type of the impurity regions 201a and 201b exists between the impurity regions 201a and 201b. In the second embodiment, the impurity regions 201a and 201b are formed by performing ion implantation of an N-type impurity into an active region which is a P-type impurity region. The P-type impurity region 223, which exists between the impurity regions 201a and 201b, functions as a potential barrier to signal electric charges existing in each electric charge accumulation region, and allows electric isolation between the impurity regions 201a and 201b. In the second embodiment, the isolation region 221 is formed in a deeper position of the substrate 100 so that the isolation region 221 exists only between the impurity regions 123a and 123b.

A manufacturing method for the photoelectric conversion apparatus according to the second embodiment will be described below.

Figure 4A:
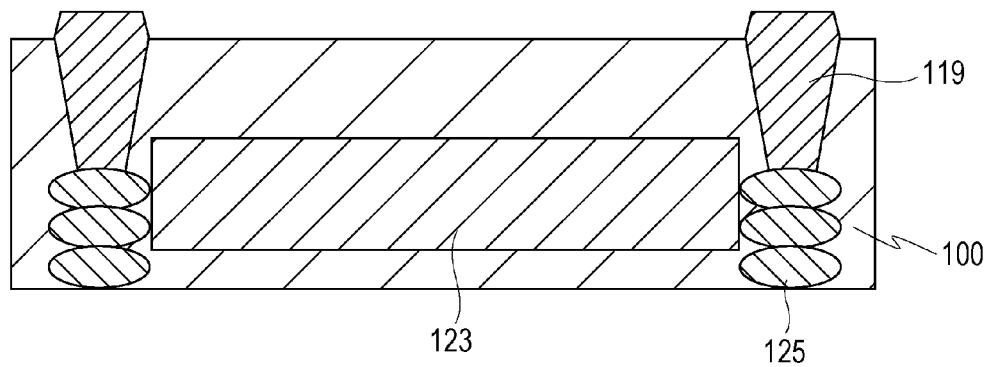
FIGS. 4A, 4B, and 4C explain a manufacturing process for the photoelectric conversion apparatus according to the second embodiment.

First, the same processes as those illustrated in FIGS. 2A to 2C are performed to form the element isolation region 119, the P-type impurity region 125, and the impurity region 123 (FIG. 4A).

Figure 4B:
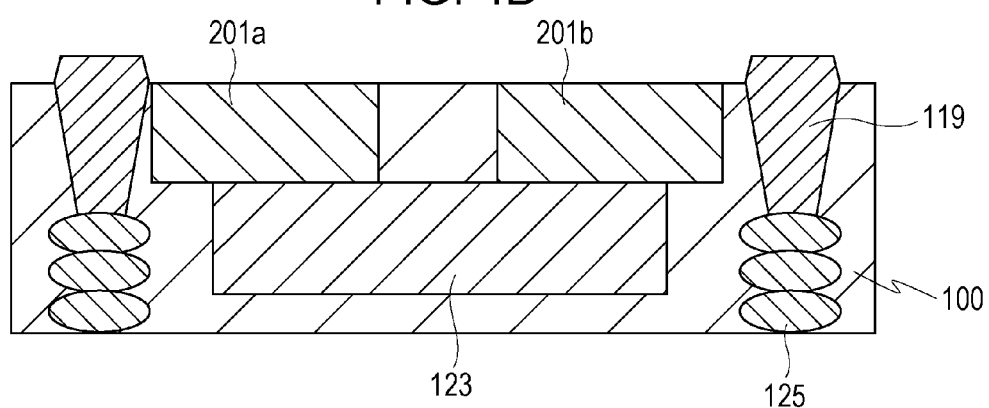

Next, by performing ion implantation of an N-type impurity into a position shallower than the impurity region 123, the impurity regions 201a and 201b are formed at mutually isolated positions (FIG. 4B). The impurity regions 201a and 201b are formed by forming isolate apertures on a resist mask corresponding to regions where the impurity regions 201a and 201b are to be formed, and by performing ion implantation into the apertures. The order of formation of the impurity region 201 and the impurity region 123 may be reversed.

Figure 4C:
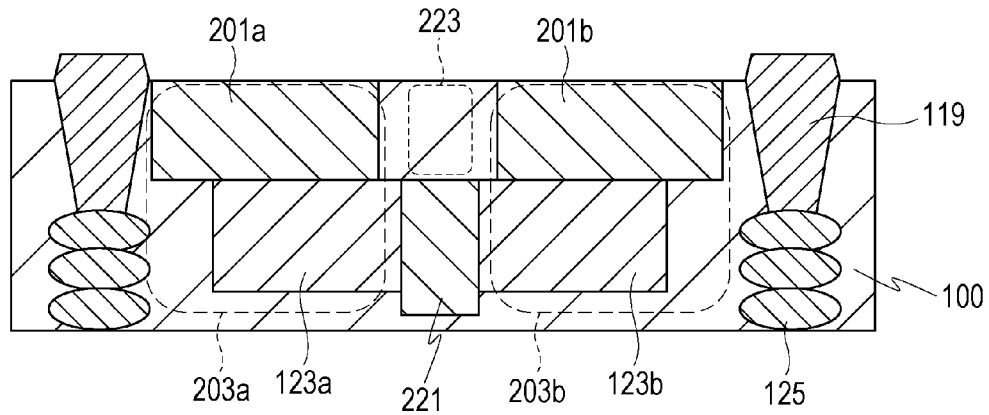

Then, by performing ion implantation of a P-type impurity into a region where the impurity region 123 has been formed, the isolation region 221 is formed. Thus, the impurity region 123 is isolated into the impurity regions 123a and 123b (FIG. 4C). The isolation region 221 may be formed between the impurity regions 201a and 201b. The formation of the isolation region 221 between the impurity regions 201a and 201b ensures electric isolation between the impurity regions 201a and 201b.

After that, the interlayer insulation film 113, the wiring 115, and the vias 117 are formed. Then, the color filter 111 and the microlens 109 are formed. Thus, the structure illustrated in FIG. 3B is obtained.

Generally, when ion implantation is performed into a deep position of a substrate, high energy is to be used for ion implantation, and therefore, a resist mask is to be formed thick enough to coat a region other than the region into which ion implantation is performed. However, achieving a highprecision patterning with a thick resist mask is more difficult than with a thin resist mask. Therefore, it is likely that a situation arises in which the area of an aperture region of the resist mask is smaller than a desired area or the shape of an aperture is distorted.

In the second embodiment, as for the formation of the impurity region 123 involving ion implantation into a deeper position, high energy for ion implantation is to be used, a continuous impurity region for multiple photoelectric conversion elements is formed, and after that, the impurity region is isolated by the isolation region 221 of an opposite conductive type. In contrast, as for the formation of the impurity region 201 involving ion implantation into a shallow position, which does not require high energy for ion implantation, isolate resist mask apertures are formed in the region where the impurity region 201a is to be formed and the region where the impurity region 201b is to be formed, and ion implantation is performed into the apertures.

Through such a method, it is possible to form part of an electric charge accumulation region, included in the electric charge accumulation region 203, at a position which is away from an isolation region with a high P-type impurity concentration. Thus, by controlling the distance between the electric charge accumulation region and the isolation region which are isolated and formed on the surface side of the substrate, a desired capacity of the electric charge accumulation region 203 can be obtained.

Further, in the second embodiment, in the electric charge accumulation regions 203a and 203b, the areas of the impurity regions 123a and 123b in the in-plane direction of the substrate are smaller than those of the impurity regions 201a and 201b. Alternatively, the widths of the impurity regions 123a and 123b in either direction of the in-plane direction of the substrate 100 are smaller than those of the impurity regions 201a and 201b. With such a configuration, the impurity regions 201a and 201b have a larger contribution to the capacities of signal electric charges in the electric charge accumulation regions 203a and 203b than the impurity regions 123a and 123b. In other words, the impurity regions 123a and 123b adjoining the isolation region 221 has a small contribution to the capacities of the electric charge accumulation regions 203a and 203b. As a result, the influence of the isolation region 221 on the capacities of the electric charge accumulation regions 203a and 203b can be reduced, and a desired property of photoelectric conversion elements can be easily achieved. The second embodiment is an example of the size relationship between the areas of the impurity region 123 and the impurity region 101 in the in-plane direction of the substrate. The size relationship between the areas of the impurity region 123 and the impurity region 101 in the in-plane direction of the substrate can be appropriately varied according to a desired property of photoelectric conversion elements. The area of each electric charge accumulation region can be obtained based on, in a plan view, an outer edge, which is the boundary surface between an N-type impurity region forming the electric charge accumulation region and a P-type impurity region positioned outside the N-type impurity region.

Further, in the second embodiment, ion implantation is performed to form the impurity regions 201a and 201b such that the P-type impurity region 223 exists between the impurity regions 201a and 201b. That is, an N-type impurity is not directly ion-implanted into the impurity region 223, which is a region between the impurity regions 201a and 201b. Therefore, the N-type impurity concentration of the impurity region 223 is lower than the N-type impurity concentration of the isolation region 221, which is positioned below the impurity region 223.

Figure 5:
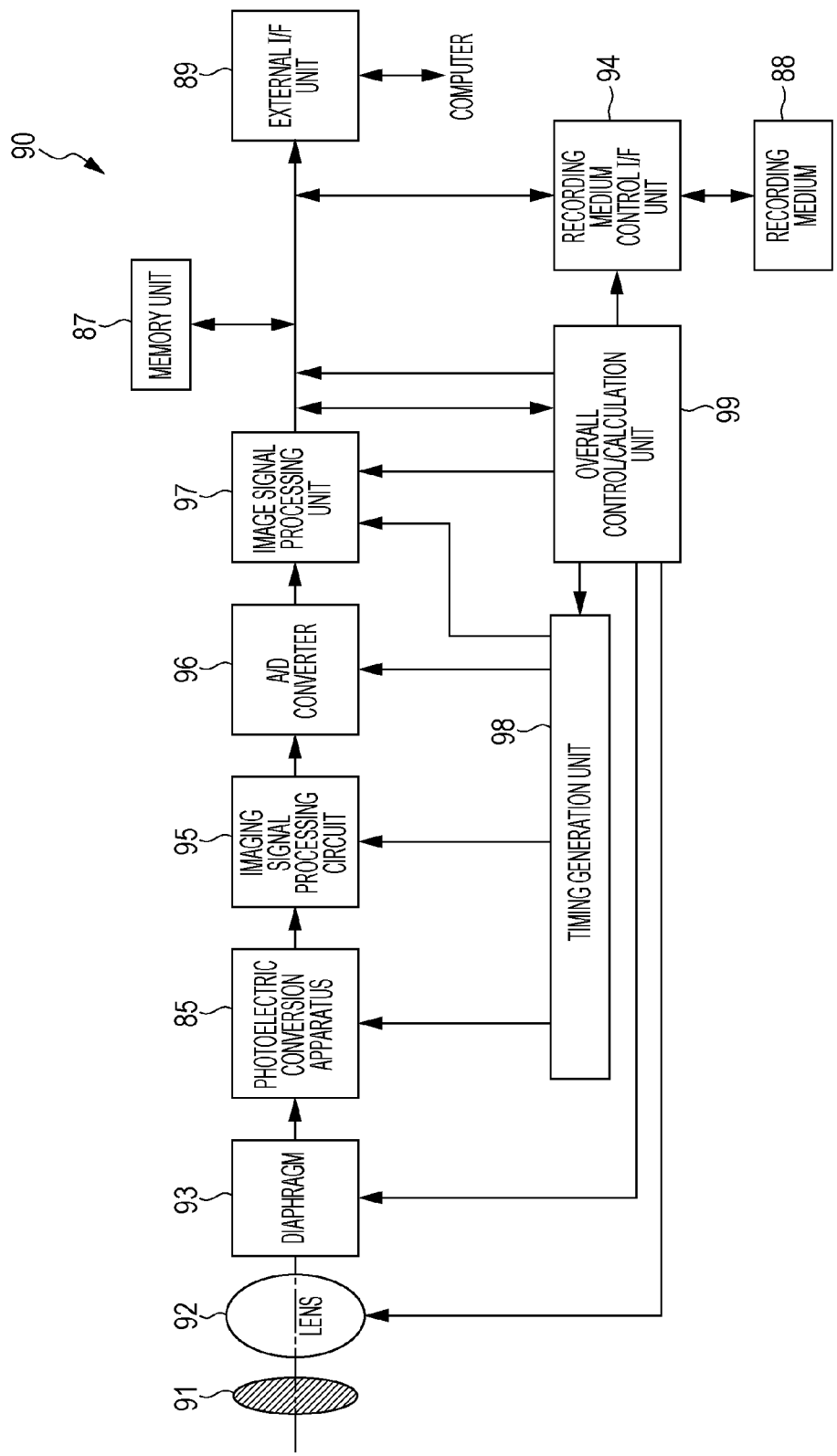
FIG. 5 explains an imaging system including a photoelectric conversion apparatus according to an embodiment of the present invention.

FIG. 5 illustrates an example of an imaging system including the above-described photoelectric conversion apparatus. As illustrated in FIG. 5, an imaging system 90 mainly includes an optical system, a photoelectric conversion apparatus 85 according to the first embodiment or the second embodiment, and a signal processing unit. The optical system mainly includes a shutter 91, a lens 92, and a diaphragm 93. The signal processing unit mainly includes an imaging signal processing circuit 95, an A/D converter 96, an image signal processing unit 97, a memory unit 87, an external I/F unit 89, a timing generation unit 98, an overall control/calculation unit 99, a recording medium 88, and a recording medium control I/F unit 94. The signal processing unit may not include the recording medium 88. The shutter 91 is provided before the lens 92 on the optical path and controls exposure. The lens 92 refracts incident light and forms an image of an object on an image pickup area of a photoelectric conversion region of the photoelectric conversion apparatus 85. The diaphragm 93 is provided between the lens 92 and the photoelectric conversion region on the optical path, and adjusts the amount of light which passes through the lens 92 and is then led to the photoelectric conversion region. The photoelectric conversion region of the photoelectric conversion apparatus 85 converts the image of the object formed on the image pickup area into an image signal. The photoelectric conversion apparatus 85 reads the image signal from the photoelectric conversion region and outputs the read image signal. The imaging signal processing circuit 95 is connected to the photoelectric conversion apparatus 85 and processes the image signal output from the photoelectric conversion apparatus 85. The A/D converter 96 is connected to the imaging signal processing circuit 95, and converts the processed image signal (analog signal) output from the imaging signal processing circuit 95 into an image signal (digital signal). The image signal processing unit 97 is connected to the A/D converter 96, performs arithmetic processing such as various types of correction onto the image signal (digital signal) output from the A/D converter 96, and generates image data. The image data is supplied to the memory unit 87, the external I/F unit 89, the overall control/calculation unit 99, the recording medium control I/F unit 94, and the like. The memory unit 87 is connected to the image signal processing unit 97, and stores the image data output from the image signal processing unit 97. The external I/F unit 89 is connected to the image signal processing unit 97. Through the external I/F unit 89, the image data output from the image signal processing unit 97 is transferred to an external device (personal computer etc.) The timing generation unit 98 is connected to the photoelectric conversion apparatus 85, the imaging signal processing circuit 95, the A/D converter 96, and the image signal processing unit 97. With this connection, a timing signal is supplied to the photoelectric conversion apparatus 85, the imaging signal processing circuit 95, the A/D converter 96, and the image signal processing unit 97. The photoelectric conversion apparatus 85, the imaging signal processing circuit 95, the A/D converter 96, and the image signal processing unit 97 are synchronized with the timing signal and operate. The overall control/calculation unit 99 is connected to the timing generation unit 98, the image signal processing unit 97, and the recording medium control I/F unit 94, and perform overall control of the timing generation unit 98, the image signal processing unit 97, and the recording medium control I/F unit 94. The recording medium 88 is removably connected to the recording medium control I/F unit 94. The image data output from the image signal processing unit 97 is recorded on the recording medium 88 through the recording medium control I/F unit 94.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-241947 filed Nov. 22, 2013, which is hereby incorporated by reference herein in its entirety.

What is claimed is:

1. A manufacturing method for a photoelectric conversion apparatus in which a microlens is arranged for multiple electric charge accumulation regions formed on a semiconductor substrate, the method comprising:

forming a first impurity region of a first conductive type on the semiconductor substrate;

after forming the first impurity region, forming a second impurity region of a second conductive type that is opposite the first conductive type in a part of the first impurity region to isolate the first impurity region into multiple regions corresponding to the multiple electric charge accumulation regions and forming a third impurity region of the first conductive type that is isolated by an impurity region of the second conductive type.

2. The manufacturing method according to claim 1, wherein forming the third impurity region includes:

forming the third impurity region of the first conductive type in a position of the semiconductor substrate which is shallower than a region where the first impurity region is formed in such a manner that the third impurity region and the region where the first impurity region is formed at least partially overlap in a plan view; and isolating the third impurity region into multiple regions by forming a fourth impurity region of the second conductive type in a part of the third impurity region.

3. The manufacturing method according to claim 1, wherein forming the third impurity region includes:

forming the third impurity region of the first conductive type in a position of the semiconductor substrate which is shallower than a region where the first impurity region is formed in such a manner that the third impurity region and the region where the first impurity region is formed at least partially overlap in a plan view, wherein the first impurity region and the third impurity region are formed in a fourth impurity region of the second conductive type, and wherein the third impurity region is isolated and the isolated third impurity regions are formed at mutually isolated positions in such a manner that an impurity region of the second conductive type exists between the isolated third impurity regions.

4. The manufacturing method according to claim 2, wherein in each of the multiple electric charge accumulation regions, a width of each of the isolated third impurity regions in an in-plane direction of the semiconductor substrate is larger than a width of each of the isolated first impurity regions.

5. The manufacturing method according to claim 3, wherein in each of the multiple electric charge accumulation regions, a width of each of the isolated third impurity regions in an in-plane direction of the semiconductor substrate is larger than a width of each of the isolated first impurity regions.

* * * * *